United States Patent [19]

Rowe

[11] 3,753,127

[45] Aug. 14, 1973

[54] PSEUDOSYNCHRONOUS COUNTER

[75] Inventor: John J. Rowe, Bowie, Md.

[73] Assignee: The Singer Company, Binghamton, N.Y.

[22] Filed: Dec. 27, 1971

[21] Appl. No.: 212,031

[52] U.S. Cl. .......................... 328/42, 328/37, 328/63

[51] Int. Cl. .......................................... H03k 21/10

[58] Field of Search .................. 328/37, 41, 48, 63, 328/42

[56] References Cited

UNITED STATES PATENTS

| | | | |
|---|---|---|---|
| 3,137,818 | 6/1964 | Clapper | 328/37 X |
| 3,238,462 | 3/1966 | Ballard et al. | 328/63 |
| 3,453,551 | 7/1969 | Haberle | 328/41 X |
| 3,670,151 | 6/1972 | Lindsay et al. | 328/37 X |

*Primary Examiner*—John S. Heyman
*Attorney*—Francis L. Masselle

[57] ABSTRACT

The disclosure describes a counter which uses ripple counters but still provides a synchronous output through the use of a buffer stage which is loaded at the end of a clock pulse at which time the count will have settled is shown. Additional stages are provided with inputs from a gate enabled by a count of all ones in the previous buffer to permit the total settling time to equal that of one stage.

5 Claims, 1 Drawing Figure

PATENTED AUG 14 1973 3,753,127
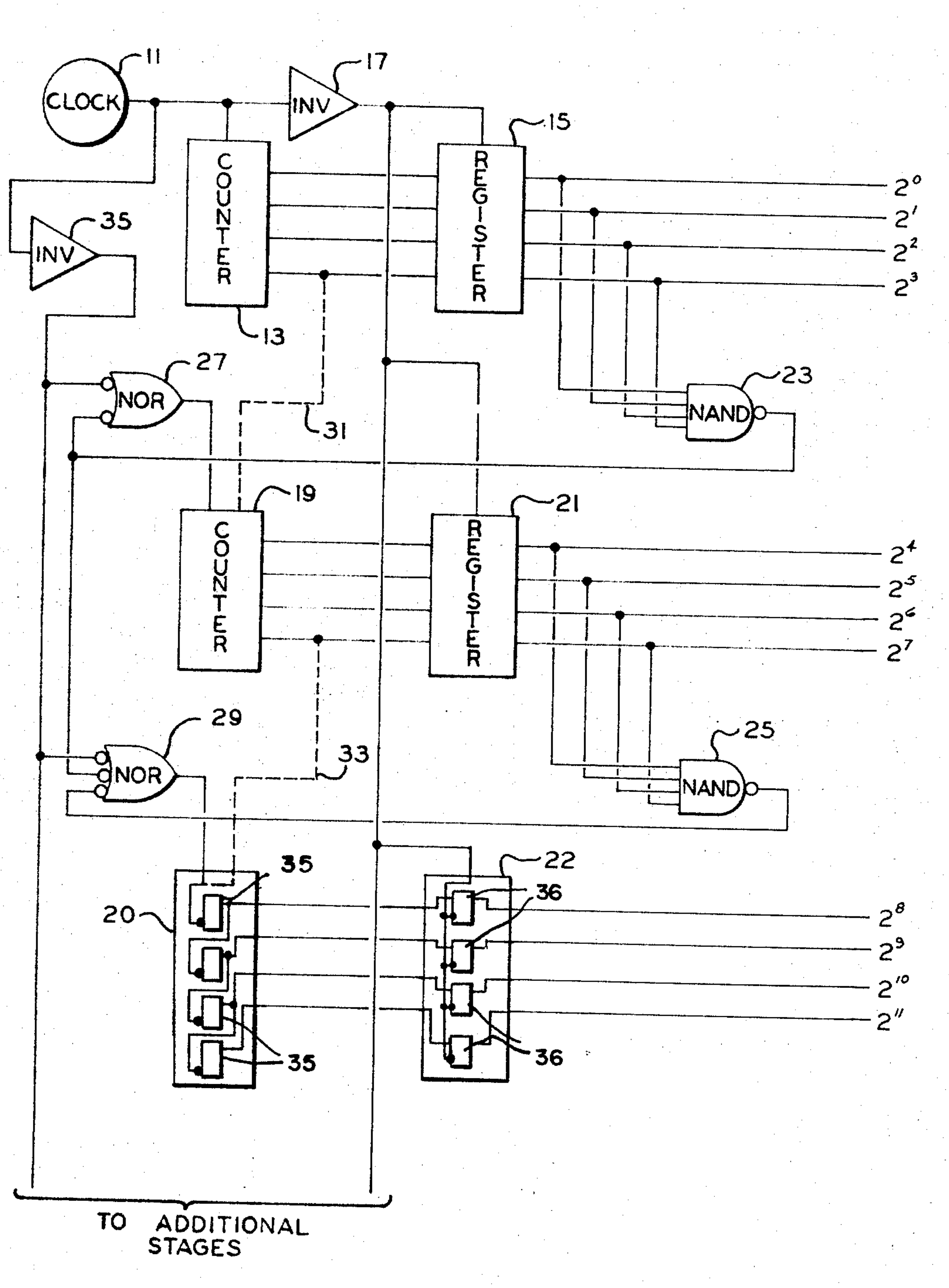
INVENTOR.
John J. Rowe
BY
John C. Altmiller
AGENT

PSEUDOSYNCHRONOUS COUNTER

This invention relates to digital counters in general and more particularly to an improved synchronous output counter.

The simplest type of digital counter is a ripple counter in which a plurality of flip flops equal to the required number of bits are connected so that the output of each successive flip flop provides an input to the next with the pulses to be counted provided to the first flip flop. Thus as an input is received it may ripple through all the flip flops before the count settles.

During the settling time any output from the ripple counter will be incorrect. Because of this problem of changing values, synchronous counters have been developed which cause all flip flops which must change on a given count to change at the same time. In general the synchronous counters have used complex gating schemes to obtain the desired synchronous change in counter output. The circuit of the present invention provides the desired simultaneous output in a less complex and less costly manner by utilizing micro circuits presently available. In this simple arrangement, ripple counters perform the actual counting with a buffer of flip flops arranged to be loaded all at one time connected between the ripple counters and the final output.

It is an object of this invention to provide new and improved digital counters.

It is a principle object of this invention to provide a digital counter having an output which changes synchronously.

Another object is to provide a digital counter using inexpensive counter circuits and output synchronous buffers.

Other objects of the invention will in part be obvious and will in part appear hereinafter.

The invention accordingly comprises the features of construction, combination of elements, and arrangement of parts, which will be exemplified in the construction hereinafter set forth, and the scope of the invention will be indicated in the claims.

For a fuller understanding of the nature and objects of the invention reference should be had to the following detailed description taken in connection with the accompanying drawings, in which:

The single FIGURE is a logic-block diagram of the preferred embodiment of the counter of the present invention.

In the Figure clock 11 provides the input pulses to be counted to a ripple counter 13 such as Texas Instruments (T.I. ) Ser. No. 7493N. This counter 13 will count on the leading edge of the input pulses. The four output lines from counter 13 (representing the four binary bits $2^0$, $2^1$, $2^2$, $2^4$) are provided as inputs to a flip flop conventional 15 such as T. I. Ser. No. 7475N. A disabling input is provided for the register 15 by the clock 11 through an inverter 17. This disabling input will keep the outputs from counter 13 from being loaded into register 15 until the trailing edge of the next clock pulse occurs. At the trailing edge of the clock pulse the output of counter 13 is loaded into register 15. Thus the out-put of register 15, which is the final circuit output, changes synchronously.

Additional stages comprising counters 19 and 20 and registers 21 and 22 are also shown along with control gates 23, 25, 27 and 29. If counts occur infrequently, then count pulses may be long enough to allow settling time for a plurality of stages. In that case gates 23, 25, 27 and 29 will not be and the the output of the last flip flop in counter 13 may be used as an input to counter 19, and the last flip flop in counter 19 may serve as an input to counter 20. This is shown by dotted lines 31 and 33. Operation will be exactly as described above except that more binary bit positions will be provided.

The counter 20 and the register 22 are shown in greater detail than the others. Each of the counters 13, 19, and 20 comprises four binary counter stages 35 which are connected in a chain with the one output of one stage 35 being connected to the clock input of the next stage 35. The outputs from the counter 22 are taken separately from each stage 35. It should be noted that the pulses from the clock 11 are applied directly to the input of the counter 13. The stages 35 count on the negative-going edge of the pulse as indicated by the small circles on the clock inputs. The registers 15, 21 and 22 are each comprised of four J-K flip-flops 36 with the set input of each of the flip-flops 36 being connected to the output of the corresponding binary stage 35, and all of the clock inputs being connected together and to the output of the inverter 17. The signals applied to the inputs of the flip-flops 36 are not entered into the flip-flops 36 until the negative-going edge of the clock pulse is applied to their clock inputs. Since the clock pulses which are applied to the registers 15, 21 and 22 are inverted, the next positive-going pulse edge after the negative-going edge which drives the counter 13, 19 and 20 enters that count into the registers 15, 21 and 22. Thus, the entire operation takes place during a single pulse time.

The gating arrangement shown in the drawing permits the maximum ripple time to be equal to that for one stage, thus allowing synchronous outputs from as many stages as are required no matter what the frequency so long as any stage will settle during the duration of a single count pulse. The number of bits in each stage may be adjusted to meet this requirement. When the outputs from all of the flip flops in register 15 are ones, NAND gate 23, which has these outputs as its inputs, will go from a high to a zero output. This output is provided as one input to NOR gate 27 enabling it to pass the next pulse from clock 11. This next pulse is inverted through inverter 35, causing the counter 19 to advance one count. Counter 13 will be advancing from all ones to all zeros at the same time, but register 15 will remain at all ones until the end of the clock pulse thus, keeping gate 27 enabled and allowing counter 19 to advance in count.

Similarly when both registers 15 and 22 contain all ones, an input must be provided for counter 20. Outputs from gates 23 and 25 enable gate 29 to permit pulses from clock 11 to advance counter 20. Additional stages may be added using the same method. The total count is transferred to the registers 15, 21 and 22 at the same time, (i.e., at the same time of the trailing edge of a clock pulse) providing an output wherein all changes occur synchronously. Gates such as TI Ser. No. 7420N and Serial No. 7402N may be used to provide the required gates and inverters.

Thus a counter having an output which changes synchronously using a small number simple inexpensive microcircuits has been shown. Although a particular logic scheme has been shown it will be evident to those skilled in the art that other equivalent logic blocks may be substituted without departing from the principles of the invention.

What is claimed is:

1. A digital counter having outputs which change synchronously, which counter comprises:

a. an n stage ripple counter arranged to advance in count on the leading edge of an input count pulse said counter having a maximum settling time less than the duration of said pulse;

b. an n stage register having its individual inputs connected to the individual outputs of said counter; and c. means to gate the outputs of said counter into said register on the trailing edge of said input pulse whereby the outputs of said register will change synchronously.

2. The invention according to claim 1 wherein said count pulses are positive, wherein said register is enabled when a positive level is applied to an enabling input, and wherein said means to gate comprises an inverter having said clock pulse as its input and having its output connected to said register enabling input.

3. The invention according to claim 1 and further including:

a. an m stage second ripple counter;

b. an m stage second register having its inputs connected thereto and to said means to gate;

c. means to provide an enabling signal when the register outputs for all said *n* stages are ones; and d. means to AND said enabling signal with said input count pulse to provide an input of said second counter.

4. The invention according to claim 3 wherein said means to provide an enabling signal comprises a gate having an output at a first level when all inputs are at one level and an output at a second level when any input is at another level, said gate having its inputs connected to the outputs of said n stage register.

5. The invention according to claim 4 wherein said gate is a NAND gate which will have a low output when all of said inputs are high, said means to AND are a NOR gate having a high output when neither input is high and having the output of said NAND gate as one input, and further including an inverter having its input connected to said count pulse and its output to said other NOR gate input, the output of said NOR gate being connected to said second counter input whereby a low input from said NAND gate and an inverted count pulse which is also low will cause a high pulse output from said NOR gate to provide a count pulse to said second group counter.

* * * * *